United States Patent
Gotoh et al.

(10) Patent No.: US 7,180,235 B2
(45) Date of Patent: Feb. 20, 2007

(54) LIGHT-EMITTING DEVICE SUBSTRATE WITH LIGHT CONTROL LAYER AND LIGHT-EMITTING DEVICE USING THE SAME

(75) Inventors: Tomohisa Gotoh, Tokyo (JP); Noriko Takewaki, Osaka (JP); Hisanao Tsuge, Tokyo (JP); Atsushi Kamijo, Tokyo (JP); Satoru Toguchi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 265 days.

(21) Appl. No.: 10/916,479

(22) Filed: Aug. 12, 2004

(65) Prior Publication Data
US 2005/0062399 A1 Mar. 24, 2005

(30) Foreign Application Priority Data
Sep. 10, 2003 (JP) ............................. 2003-319105

(51) Int. Cl.
*H01J 1/62* (2006.01)
*H01J 63/04* (2006.01)
*H01L 29/22* (2006.01)

(52) U.S. Cl. .................. 313/497; 313/504; 313/506; 313/491; 257/98; 257/40

(58) Field of Classification Search ............... 313/491, 313/497, 504, 506; 257/98, 40
See application file for complete search history.

(56) References Cited

U.S. PATENT DOCUMENTS 5,946,281 A * 8/1999 Ito et al. ................ 369/112.07
2001/0033135 A1* 10/2001 Duggal et al. .............. 313/506
2002/0036958 A1* 3/2002 Wada et al. .............. 369/44.23
2003/0062520 A1* 4/2003 Toguchi et al. ............... 257/40
2004/0264347 A1* 12/2004 Wada et al. ............ 369/112.02
2005/0051791 A1* 3/2005 Gotoh et al. .................. 257/99
2005/0127832 A1* 6/2005 Toguchi et al. ............. 313/512
2005/0226122 A1* 10/2005 Ooi et al. ............. 369/112.05

FOREIGN PATENT DOCUMENTS

| JP | 63-314795 | 12/1988 |
|----|-----------|---------|
| JP | 01-220394 | 9/1989 |
| JP | 2001-202827 | 7/2001 |
| JP | 2001-220394 | 8/2001 |
| JP | 2003-031374 | 1/2003 |
| JP | W O03/084291 A1 * | 10/2003 |

* cited by examiner

*Primary Examiner*—Mariceli Santiago
*Assistant Examiner*—Peter Macchiarolo
(74) *Attorney, Agent, or Firm*—H.C. Park & Associates, PLC

(57) ABSTRACT

A first layer having a refractive index higher than that of a light transparent substrate is formed on the light transparent substrate, and a second layer having a refractive index higher than that of the first layer is formed on the first layer, and an electrode layer having a refractive index higher than that of the second layer is formed on the second layer in accordance with the present invention. By means of this configuration, a spherical-wave-shaped wavefront emitted from a point light source of an emission layer of a light-emitting device to all directions, is converted to a plane-wave-shaped wavefront within the substrate, which allows the light to be effectively emitted outside the substrate, so that a light-emitting device substrate having good light extraction efficiency and a light-emitting device using the same may be provided.

18 Claims, 7 Drawing Sheets

RELATIVE VALUE
OF REFRACTIVE INDEX

LIGHT-EMITTING DEVICE SUBSTRATE WITH LIGHT CONTROL LAYER AND LIGHT-EMITTING DEVICE USING THE SAME

CROSS-REFERENCE TO RELATED APPLICATION

This application claims the benefit of Japanese Patent Application No. 2003-319105, filed Sep. 10, 2003, the disclosure of which is hereby incorporated herein by reference in its entirety.

BACKGROUND OF THE INVENTION

1. Field of the Invention

The present invention relates to a substrate for a light-emitting device and an optical device using the same, and the optical device of the present invention is used for a display device such as display. In addition, the present invention is applied to an encapsulating member for an organic electroluminescent (EL) device.

2. Description of the Related Art

An organic electroluminescent (EL) device is an emissive device using a principle that a fluorescent material emits light by means of recombination energy of holes injected from an anode and electrons injected from a cathode when an electric field is applied thereto. Researches have been conducted with regard to the organic EL device comprised of organic material after a stacked type low voltage driving organic EL device was disclosed in the art. Tang et al uses tris(8-quinolinol)aluminum for an emission layer, and uses triphenyldiamine for a hole transporting layer. The stacked type structure has an advantage in that efficiency of injecting the hole into the emission layer may be increased, efficiency of forming an exciton resulted from recombination by blocking the electron injected from the cathode may be increased, and the exciton formed in the emission layer may be blocked. For the structure of the organic EL device as mentioned above, two-layer type of a hole transporting (injecting) layer and a hole transportable emission layer, or three-layer type of a hole transporting (injecting) layer, an emission layer and an electron transporting (injecting) layer are well known in the art. In order to increase the recombination efficiency of the injected electron and hole in the stacked type device, researches for the device structure or a method for forming the same are conducted. However, the organic EL device has a limitation for the probability of singlet generation due to dependency of spin statistics when carriers are recombined, which causes to have an upper limit of a luminescence probability. The value of this upper limit is known to be about 25%.

In the surface emitting device having spherical-wave-shaped wavefront such as the organic EL device with at least emission layer interposed between an anode and a cathode, a refractive index of the luminous body is higher than a substrate or air, so that the light of an exiting angle more than a critical angle is totally reflected at a substrate/air interface or the like, which causes the light not to be extracted outside the substrate. It is expected that only 20% of the total amount of light emitted is available when the refractive index of the luminous body is 1.6. As such, energy converting efficiency becomes low, which is limited to be about 5% in total when singlet formation probability is added to. In the organic EL device that has a luminescence probability highly limited, low light extraction efficiency as mentioned above causes degradation of the energy converting efficiency, which may be severely and adversely affected.

As for the technique of improving the light extraction efficiency, several proposals have been suggested in the prior art.

Japanese patent publication No. S63-314795 discloses a method for forming a lens on a substrate. A substrate having a focusing property such as selfoc or convex lens is used for the disclosure.

Japanese patent publication No. H01-220394 discloses a method for forming a reflective surface as a technique for improving the light extraction efficiency. This publication is characterized in that a mirror for reflecting light is arranged at one side of an emission layer, and the mirror is shaped to be a mortar to prevent light loss around the emission layer.

Japanese patent publication No. 2001-202827 discloses a method for arranging a low refractive layer between a substrate and an electrode layer. According to this disclosure, a transparent conductive layer (namely, electrode layer) is formed in contact with at least one surface of the low refractive layer, so that light transmitting the low refractive layer may be highly extracted out to the air, and the extraction efficiency for extracting the light out of the structure as mentioned above becomes higher, and the refractive index of the low refractive layer is 1.003 to 1.300, so that the light transmitting the low refractive layer becomes highly extracted out to the air, and the light extraction efficiency for taking the light out of the structure becomes higher, and silica aerogel is used for the low refractive layer, which leads to implement an ultra low refractive index close to 1.

Japanese patent publication No. 2003-31374 discloses a light-emitting device having an anti-reflective layer that comprises a high refractive layer, a low refractive layer, and a high refractive layer in this order between an emission layer and a substrate. In accordance with this disclosure, FIG. 1 shows an optical multilayer body 2 comprised of a high refractive layer H1, a low refractive layer L1, and an anode layer 2A as a high refractive layer in this order between a substrate 1 made of a glass and an organic EL layer 3. And paragraph number [0025] thereof describes that the optical multilayer body 2 has an anti-reflective property and the light extraction efficiency from the substrate 1 is improved.

When the anti-reflective layer is formed of a single layer, reflective light is canceled off by light interference when $nd=\lambda/4$ (wherein d is thickness of physical layer and $\lambda$ is wavelength to used) is met. The invention of the above-mentioned disclosure relates to one kind of such anti-reflective layer, and has a multi layered structure. Thickness of the high refractive layer H1, low refractive layer L1 and anode electrode layer 2A are 14.2 nm, 41.5 nm, and 139.8 nm, respectively, and the thickness of each layer is set to be not more than half wavelength of the emission wavelength of 400 to 700 nm in the structure described in its embodiment (see paragraph No. 0015). The multi layer described in this publication is one kind of so called anti-reflective layer.

However, these prior arts still need to be improved.

The method for forming lens or reflective surface on a substrate described in Japanese patent publication No. 1989-314795 or 2001-220394 is effective in a device having is a large emission area, but not suitable for forming lens with a focusing property or side reflective surface in a device having a fine pixel area such as dot matrix display. In particular, layer thickness of the organic EL device is several μm or less, forming a reflective mirror to be a tapered shape at a side of the device is not possible with a current technique for fine processing, which obviously and significantly causes high cost.

The method for interposing a low refractive layer between a substrate and an electrode layer as described in Japanese patent publication No. 2001-202827 is effective in terms of improving light extraction efficiency by collecting light within a critical angle, however, the light becomes reflected from an interface between an anode electrode and the low refractive layer, so that it is not sufficient for improving the light extraction efficiency. In addition, when a porous silica aerogel layer is used so as to obtain an ultra low refractive layer, mechanical intensity of the layer becomes very weak. Furthermore, an electrical short circuit occurs due to surface unevenness of the porous layer, which causes non-emission region (namely, dark spot) to be occurred. As such, the technique for light extraction still needs to be improved for the organic EL device.

The method for arranging the anti-reflective layer as described in the Japanese patent publication No. 2003-31374 has been limited to improve the light extraction efficiency in terms of its function (which will be described in the embodiment paragraph later).

In addition, as is well known in the art, the anti-reflective layer is highly dependent on wavelength, so that the light extraction efficiency is greatly varied due to the emission wavelength. Because of this factor, when the technique described in the same publication is applied to a white emitting device, the amount of light emitted outside the substrate is dependent on wavelength, which causes the amount to be greatly different from one is another based on the wavelength, so that white balance is degraded.

Furthermore, the anti-reflective layer is one that uses light interference to cancel off the light reflection, it needs to be formed to have its layer thickness or refractive index met with predetermined conditions. Thus, when the layer thickness is finely varied according to fabrication factors, the reflectivity of the anti-reflective layer is varied, which readily causes variation of the device performance.

Development of the light extraction technique is of major interest for applying it to a low voltage drive of light-emitting device such as organic EL device, and is inevitable for implementing low power consumption of the device.

SUMMARY OF THE INVENTION

It is, therefore, an object of the present invention to provide a light-emitting device substrate having good light extraction efficiency, and the light-emitting device using the same, which has overcome the problems of the prior art as mentioned above.

As is described in the prior art, providing a focusing property to the substrate, or forming an anti-reflective layer between the substrate and the emission region has been proposed. Inventors of the present invention have researched the problems in other terms of the above-mentioned proposals to thereby succeed, thus remarkably improving the light extraction efficiency. In other words, the inventors have arranged a light control portion on the light transparent substrate, which performs wavefront conversion of the emitting light to be guided into the light transparent substrate to thereby complete the present invention of capable of improving the light extraction efficiency.

According to an aspect of the present invention, there is provided a light-emitting device substrate, which comprises a light transparent substrate; and a light control portion formed on the light transparent substrate, and for converting a spherical wave shaped incident light to a plane-wave-shaped light to be guided into the light transparent substrate.

According to another aspect of the present invention, there is provided a light-emitting device, which comprises a light transparent substrate; a light control portion formed on the light transparent substrate and for converting a spherical wave shaped incident light into a plane-wave-shaped light to be guided into the light transparent substrate; an electrode layer formed on the light control portion; and an emission layer formed on the electrode layer.

According to the present invention, the light extraction efficiency is remarkably increased by the light control portion formed on the light transparent substrate. The light control portion converts the spherical wave shaped light emitted from its upper portion into the plane-wave-shaped light to be guided into the light transparent substrate. Since the plane-wave-shaped light is guided into the light transparent substrate, light reflection or loss between the light transparent substrate and its adjacent layer may be effectively reduced, which leads to remarkably improve the light extraction efficiency.

In this case, "the plane-wave-shaped light" means that point vector of the light is approximately even. Light phase in a plane vertical to the light propagation direction may not be necessarily present. "Wavefront conversion" means that the wavefront is converted to increase directivity of the light, which converts the spherical wave shaped light where the point vector is diffused into the plane-wave-shaped light as mentioned above. Several shapes may be employed for the configuration of wavefront conversion into the plane-wave-shaped light. For example, the wavefront conversion may be performed by introducing a refractive index varying region in the light control portion and properly adjusting the light propagation.

In addition, the "light-emitting device substrate" means one that is used with an emission region mounted on an upper portion of the light control portion. Several shapes may be employed for the emission region. For example, it may include an emission layer of organic or inorganic EL device.

In the present invention, the light control portion may be arranged on the light transparent substrate and consists of light control layers, some of the light control layers having refractive index distribution.

In the above-mentioned configuration, a portion where a low refractive region and a high refractive region are adjacent to each other may be the wavefront converting region. In other words, when the light is introduced from the low refractive region to the high refractive region, wavefront of the light is converted at the interface therebetween, so that the spherical wave shaped light becomes the plane-wave-shaped light. In this configuration, since the light control portion is shaped to be layered, high fabrication safety may be obtained.

As mentioned above, the light control portion having a wavefront converting function is arranged within the layer structure forming the device, which leads to remarkably improve the light extraction efficiency. However, when such light control portion is arranged, a new light loss portion may be present within the layer structure. In this case, an effect of light control is reduced by the light loss. In other words, when the light control portion having the wavefront converting function is arranged, the above configuration becomes accompanied with a new problem. Therefore, the present invention provides the configuration as below to cope with the above problem.

To detail this, the light control layer may have a configuration that distributes the refractive index, which becomes lower from the light transparent substrate toward its upper portion in accordance with the present invention.

When the light propagates from the high refractive region to the low refractive region, light reflection or light loss occurs at the interface therebetween. In accordance with the above-mentioned configuration, when the emission region is formed on the light control layer to allow the light to emit from the light transparent substrate, the refractive index becomes lower along the propagation direction of the light. Therefore, the above-mentioned interface where the light reflection or light loss occurs is not present, which leads to remarkably improve the light extraction efficiency. In the refractive index distribution of the configuration where the refractive index is reduced from the light transparent substrate toward its upper portion, however, step shaped or continuous shaped distribution may also be employed. Alternatively, the refractive index may be reduced toward the layer thickness direction over the whole light control layer or at some regions thereof.

In the present invention, the light-emitting device substrate further comprises an electrode layer on the light control layer, and a refractive index near the upper surface of the light control layer may be higher than that of the electrode layer. In accordance with this configuration, light reflection or light loss in the interface between the light control layer and its upper portion is suppressed. In other words, the refractive index becomes reduced from the light control layer toward the electrode layer. Therefore, the light extraction efficiency becomes further improved.

The light control layer may include a first layer formed on the light transparent substrate, and a second layer formed on the first layer and having a refractive index lower than that of the first layer.

The interface between the first layer and the second layer becomes the wavefront converting region in accordance with this configuration. The wavefront of the light is converted in this interface, so that the spherical wave shaped light becomes the plane-wave-shaped light. Since the wavefront is performed at the interface of these layers, the plane-wave-shaped light is effectively and safely guided into the light transparent substrate, which leads to improve the light extraction efficiency.

In this case, the first layer is preferably formed to be contacted with the light transparent substrate. With this configuration, the plane-wave-shaped light is guided into the light transparent substrate as it is, the light reflection or light loss in the interface between the light transparent substrate and its upper layer, which has been problems in the prior art, may be effectively suppressed.

In addition, $n_1 d_1 \geq \lambda/2$ may be met when the peak emission wavelength is $\lambda$, the refractive index of the first layer is $n_1$ and its thickness is $d_1$.

In addition, $n_2 d_2 \geq \lambda/2$ may be met when the refractive index of the second layer is $n_2$ and its thickness is $d_2$.

With this configuration, the wavefront of the light is properly converted into the plane-wave-shaped light in the interface of the first and second layers, which leads to obtain the improved light extraction efficiency.

A driving circuit for driving the light-emitting device may be arranged in the light transparent substrate in accordance with the present invention. For example, a device such as TFT may be formed.

In addition, the upper direction is defined from the light transparent substrate toward the light control portion in the present invention.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In addition, the term "the refractive index" refers to as one of peak wavelength of light emitted from an emission layer, if not specifically described in the present specification. Like numbers refer to like devices throughout the specification to thereby omit description thereof.

The light-emitting device substrate in accordance with the present invention may be applied to the light-emitting device that emits light resulting from an external stimulus such as voltage, and, for example, it may be applied to a light-emitting device such as organic EL device, inorganic EL device plasma display, and LED. In particular, the light-emitting device may have a remarkable effect on a device where the light is emitted from a point light source of an emission region. For example, light emission of EL device is collection of point light emission from the emission center of the emission layer, which leads to have a significant effect of the present invention.

The present invention has the light extraction efficiency improved by means of a function of a light control layer. The operation of the light extraction efficiency is less dependent on wavelength than an anti-reflective layer. Thus, when it is applied to a white light-emitting device, the amount of light emitted outside the substrate is not significantly different from one another based on the wavelength, and white balance may be relatively maintained in a good state. In addition, variation of device performance due to a manufacturing factor or the like may be relatively suppressed, which may be the advantage of the present invention.

First Embodiment

Figure 1:
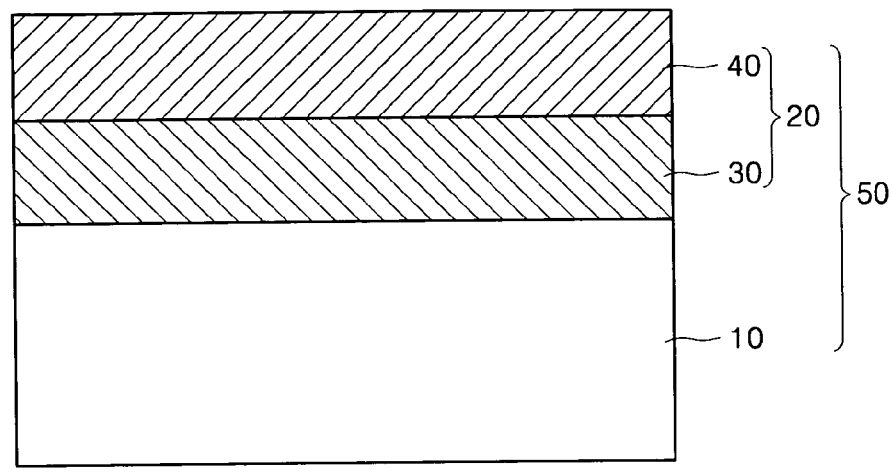
FIG. 1 to FIG. 3 schematically shows cross-sectional views of a substrate for a light-emitting device in accordance with a first embodiment of the present invention.

FIG. 1 schematically shows a cross-sectional view of a substrate for a light-emitting device in accordance with the present embodiment. To detail this, a light-emitting device substrate 50 of the present invention comprises a light control layer 20 on one side of a light transparent substrate 10. The light control layer 20 consists of a first layer 30 having a refractive index higher than that of the light transparent substrate 10 and a second layer 40 having a refractive index lower than that of the first layer 30, which are stacked onto the light transparent substrate 10 in this order.

This optical device substrate has an emission region above the light control layer and is used for a substrate of the light-emitting device. The light control layer 20 converts a spherical-wave-shaped wavefront introduced from its upper direction to a plane-wave-shaped wavefront. A center of the emission layer such as organic EL device is treated as a point light source, and light emitting from the point light source propagates to all directions of 360°. In only a typical light transparent substrate, the spherical-wave-shaped wavefront emits from the emission center outside the substrate, and an exiting angle above a critical angle is reflected within the substrate by total reflection and can not be emitted outside the substrate. However, at an interface between the first layer 30 and the second layer 40 in the present embodiment, the spherical-wave-shaped wavefront is converted into the plane-wave-shaped wavefront to thereby be light having high directivity. By means of this configuration, the spherical-wave-shaped wavefront emitted from the point light source is converted into to the plane-wave-shaped wavefront after it passes through the light control layer 20, and passes the light transparent substrate 10 while maintains the directivity. As a result, an amount of total reflection light is small, and a lot of light are emitted by the outside of the light transparent substrate 10, which leads to improve light extraction efficiency. The light emitting outside the substrate is not the spherical or cylindrical-wave-shaped wavefront but the plane-wave-shaped wavefront. Each layer consisting of the light-emitting device substrate in accordance with the present invention is optically planarized, and a thin film material having high mechanical intensity may be selected for the layer, so that the light-emitting device having high reliability may be provided. In other words, an electrical short circuit due to unevenness of the substrate surface may be suppressed from occurring, and a crack of the thin film due to the substrate disformation may also be suppressed.

Figure 2:
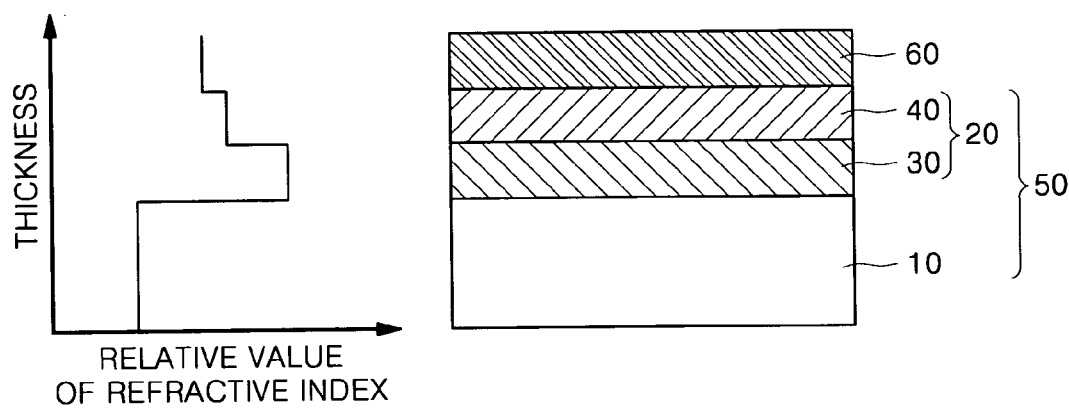

FIG. 2 shows a cross-sectional view of a substrate where an electrode layer 60 is arranged on the upper surface of the light-emitting device substrate 50 of FIG. 1. The electrode layer 60 has a refractive index lower than that of the second layer 40.

In order to improve the light extraction efficiency in this light-emitting device substrate, two interfaces perform a major function. One is the interface between the light transparent substrate 10 and the first layer 30, and the other is the interface between the first layer 30 and the second layer 40. In these interfaces, light diffusing from the emission layer as the spherical-wave-shaped wavefront may be converted into the plane-wave-shaped wavefront. Therefore, configuration of these two interfaces and configuration of introducing light into these interfaces are important in accordance with the present embodiment. In the configuration of the present invention, light emitting from the emission layer passes through the electrode layer 60, and continues to pass through the second layer 40, first layer 30, and finally the light transparent substrate 10 to be emitted outside the light transparent substrate 10. Therefore, the refractive index continues to be higher from the electrode layer 60 to the light transparent substrate 10 and becomes lower from the light transparent substrate 10 in the present invention, as is shown with a relative value of refractive index in FIG. 2.

As mentioned above, when an interface is present where light propagates from a high refractive layer to a low refractive layer, light reflection or loss occurs in the interface. Such interface is not present in the configuration from the electrode layer 60 to the light control layer 20 in FIG. 2, which leads to implement good light extraction efficiency.

Hereinafter, each portion forming the light-emitting device substrate 50 will be described in detail in accordance with the present embodiment.

The light transparent substrate 10 is used as a light extraction substrate of a light-emitting device. It transmits some wavelengths in at least a visible light band. The light transparent substrate 10 in the present embodiment may allow at least some light of wavelength 400 to 800 nm to be transmitted, and organic or inorganic material may be used for the same. Glass or the like may be used for the inorganic material, and plastic or the like may be used for is the organic material. The glass may include melted quartz, non-alkali glass, soda glass, or optical glass such as heavy print glass. The plastic may include engineering plastic such as polyethylsulphon (PES), polyethyleneterephtalate (PET). The refractive index of the light transparent substrate 10 is preferably 1.4 to 2.1. A barrier layer for suppressing moisture or oxygen from being transmitted may be coated on the light transparent substrate 10. In addition, color converting filter or color filter may be attached to the same. The thickness of the light transparent substrate 10 is not specifically limited, however, about 0.1 to 2 mm is preferable in terms of utility.

Figure 9:
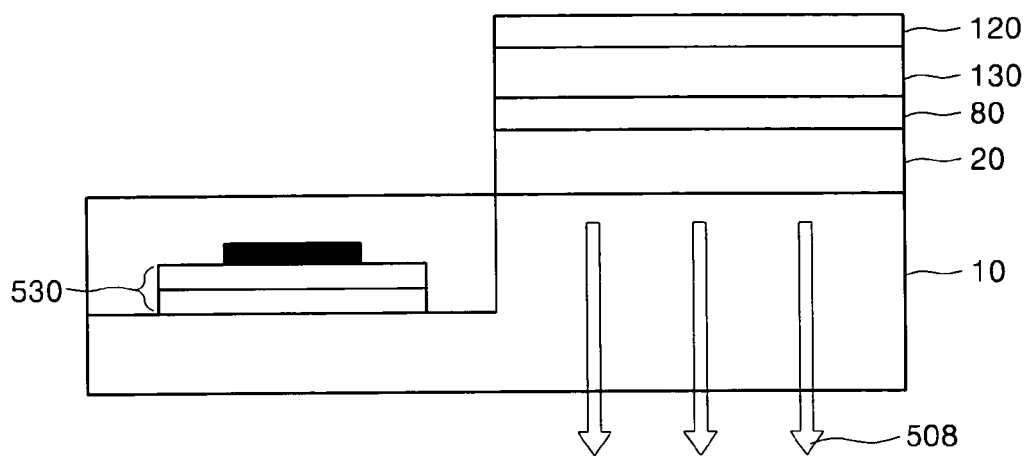

The substrate shown in FIG. 1 and FIG. 2 is the light-emitting device substrate, and a driving circuit for the light-emitting device is formed on the light transparent substrate 10. FIG. 9 shows a schematic structure of an organic EL device having thin film transistor (TFT). A TFT device portion 530 is formed on the light transparent substrate 10. The substrate in accordance with the present embodiment is preferably used for such device portion.

The light-emitting device substrate 50 in accordance with the present invention is manufactured to sequentially stack the first layer 30 and the second layer 40 on the light transparent substrate 10. An optical device in accordance with the present embodiment is manufactured to stack at least an electrode layer 60 and an emission layer on the light-emitting device substrate 50. As such, when the light transparent substrate 10 has an uneven portion on its surface, this uneven portion affects the electrode layer 60 or the emission layer, which may cause an electrical short circuit. Therefore, even substrate is preferably used as the light transparent substrate 10. Furthermore, an active matrix driving substrate is preferably even at least in a pixel portion for operating the light-emitting device.

The first layer 30 has a refractive index higher than that of the light transparent substrate 10. For example, when the refractive index of the light transparent substrate 10 is 1.45, the refractive index of the first layer 30 is practically and preferably higher than 1.45 to be in a range between about 1.46 to about 2.5. A ratio of the refractive index of the first layer 30 with respect to that of the light transparent substrate 10 (that is, refractive index of the first layer 30/refractive index of the light transparent substrate 10) is preferably high. The ratio is more than 1, preferably 1.15 or more, and more preferably 1.3 or more. As a result, the light transparent substrate 10 having a refractive index of about 1.45 may be used, which has high general usage, and the light control layer capable of significantly performing a wavefront converting function may be formed on the light transparent substrate.

When the peak wavelength of light emitting from the emission layer is λ(□) and the refractive index of the first layer 30 is n1 and its thickness is d1, the optical thickness of the first layer 30, namely, n1d1 is preferably above 0.5 λ, and more preferably above λ. As a result, the light incident from the second layer 40 is preferably subject to wavefront conversion to be a plane-wave-shaped light, which allows to reliably implement an improving effect of the light extraction efficiency. As for the upper limit of n1d1, its value is preferably not more than 10 λ. As a result, the wavefront conversion into the plane-wave-shaped light may be reliably implemented.

Organic or inorganic material may be used for forming the first layer 30 of the light-emitting device substrate. Polyimide, polyurethane or the like may be used for the organic material, and $SiO_2$, $TiO_2$, SiNx, $Al_2O_3$, $Ta_2O_5$, $ZrO_2$, $CeO_2$, $Y_2O_3$, MgO, $Nb_2O_5$, ITO or the like may be used for the inorganic material. Only one of them or combination of at least two kinds of materials may be used. It is preferable that the inorganic material is used in consideration of thermal stability or the like.

The first layer 30 may preferably allow some portion of wavelength of 400 to 800 nm to be transmitted. Optical thin films of them may be manufactured by a wet or dry forming method. The wet forming method may include sol-gel method or the like, and the dry forming method may include chemical vapor deposition (CVD) or physical vapor deposition such as deposition, plasma sputtering and ion beam sputtering. To detail this, the CVD method may include PECVD, MOCVD, laser CVD, photochemical CVD and electron cyclotron resonance CVD. In addition, the deposition may include resistive heating evaporation, electron beam deposition, laser deposition, arc discharge deposition, RF heating deposition or the like. The plasma sputtering may include direct current sputtering, RF sputtering, counter target sputtering, magnetron sputtering or the like. In addition, an ion source of the ion beam sputtering may include penning type, hollowcathode type and duo plasmatron type or the like.

The second layer 40 has a wavefront converting function as the first layer 30 does.

When refractive indices of the first layer 30, the second layer 40, and the electrode layer 60 are n1, n2, n3, respectively, these indices are set to be $n1 \geq n2 \geq n3$. For example, when the refractive index of the first layer 30 is 2.4 and that of the electrode layer 60 is 1.75, the refractive index of the second layer 40 is present therebetween. The value of the n1/n2 is above 1, preferably 1.1 or more, and more preferably 1.25 or more.

When the peak wavelength of light emitting from the emission layer is λ(μm and the refractive index of the second layer 40 is n2 and its thickness is d2, the optical thickness of the second layer 40, namely, n2d2 is preferably above 0.5 λ, and more preferably above λ. As a result, the light emitting from the second layer 40 is preferably subject to wavefront conversion to be a plane-wave-shaped light at an interface between the first layer 30 and the second layer 40, which allows to reliably implement an improving effect of the light extraction efficiency. As for the upper limit of n2d2, its value is preferably not more than 10 λ. As a result, wavefront conversion into the plane-wave-shaped light may be reliably implemented. In addition, the refractive index of the second layer is preferably not less than 1.35. When the refractive index of the second layer is too low, density of the second layer may be too lowered to fail to obtain sufficient mechanical intensity.

Organic or inorganic material may be used for forming the second layer 40 of the light-emitting device substrate. Polyimide, polyurethane or the like may be used for the organic material, and $SiO_2$, $TiO_2$, SiNx, $Al_2O_3$, $Ta_2O_5$, $ZrO_2$, $CeO_2$, $Y_2O_3$, MgO, $Nb_2O_5$, ITO or the like may be used for the inorganic material. Only one of them or combination of at least two kinds of them may be used. It is preferable that the inorganic material is used in consideration of thermal stability or the like.

The second layer 40 may preferably allow some portion of wavelength of 400 to 800 nm to be transmitted. Optical thin films of them may be manufactured by a wet or dry forming method. The wet forming method may include sol-gel method or the like, and the dry forming method may include chemical vapor deposition (CVD) or physical vapor deposition such as deposition, plasma sputtering and ion beam sputtering. To detail this, the CVD method may include PECVD, MOCVD, laser CVD, photochemical CVD and electron cyclotron resonance CVD. In addition, the deposition may include resistive heating evaporation, electron beam deposition, laser deposition, arc discharge deposition, RF heating deposition or the like. The plasma sputtering may include direct current sputtering, RF sputtering, counter target sputtering, magnetron sputtering or the like. In addition, an ion source of the ion beam sputtering may include penning type, hollowcathode type and duo plasmatron type or the like.

In this case, the second layer 40 is formed after the first layer 30 is formed, so that the method for forming film is preferably selected which does not resolve the first layer 30.

In addition, a material suitable for a process for fabricating the electrode layer or the emission layer to be formed on the first layer 30 and the second layer 40 needs to be selected for the first and second layers.

In the present embodiment, the first layer 30 or the second layer 40 may acts as an auxiliary electrode for lowering resistance of the electrode layer 60. These layers may not only contribute to optical properties but also electrical properties. When these layers are used as the auxiliary electrode, conductive material such as ITO is used for the constitutional material and is connected to the electrode layer 60 to lower resistance of the electrode layer 60. When the second layer 40 is used as the auxiliary electrode, it may be directly connected to the electrode 60, and when the first layer 30 is used as the auxiliary, it may be connected to the electrode 60 through contact hole or the like.

Figure 3:
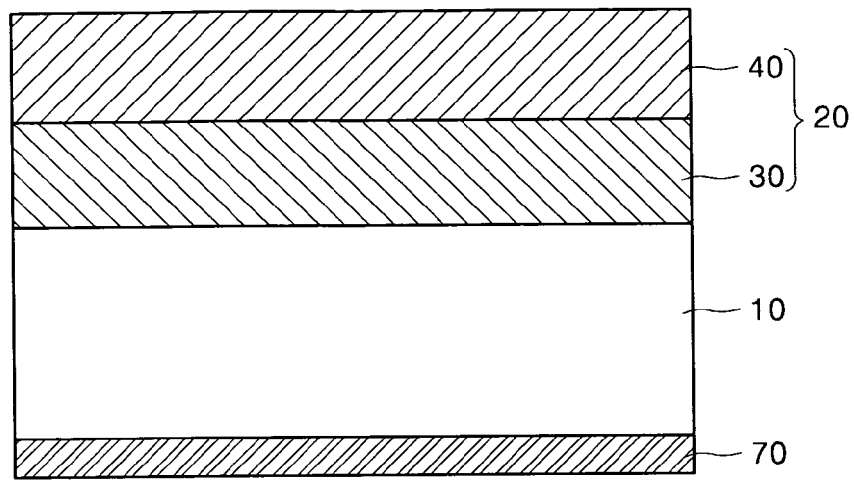

The light-emitting device substrate in accordance with the present embodiment may include an anti-reflective layer. The anti-reflective layer in the first embodiment includes the anti-reflective layer at an interface where emitting light transmits the light-emitting device substrate 50 and emits to the air, namely, at an interface between the air layer and the light transparent substrate 10, which leads to improve the light extraction efficiency. FIG. 3 schematically shows a cross-sectional view of an optical device having an anti-reflective layer. The anti-reflective layer 70 is formed on one surface of the light transparent substrate 10, and the light control layer 20 consisting of the first layer 30 and the second layer 40 is formed on the other surface of the light transparent substrate 10, wherein the first layer 30 has a refractive index higher than that of the light transparent substrate 10, and the second layer 40 has a refractive index lower than that of the first layer 30. In the first embodiment of the present invention, the refractive index of the first layer 30 is above that of the electrode layer 60, so that significant reflection does not occur until the light emitting from the emission layer becomes incident into the light control layer 20. Therefore, the light diffusing from the emission layer as a spherical-wave-shaped wavefront is not subject to the significant reflection but incident into the light control layer 20 to be converted into a plane-wave-shaped wavefront. The interface between the air layer and the light transparent substrate 10 is subject to the significant reflection, and it is effective to arrange the anti-reflective layer at the interface, however, when it is arranged in other position, it may cause the converting efficiency from the spherical-wave-shaped wavefront to the plane-wave-shaped wavefront to be lowered.

Second Embodiment

Figure 4:
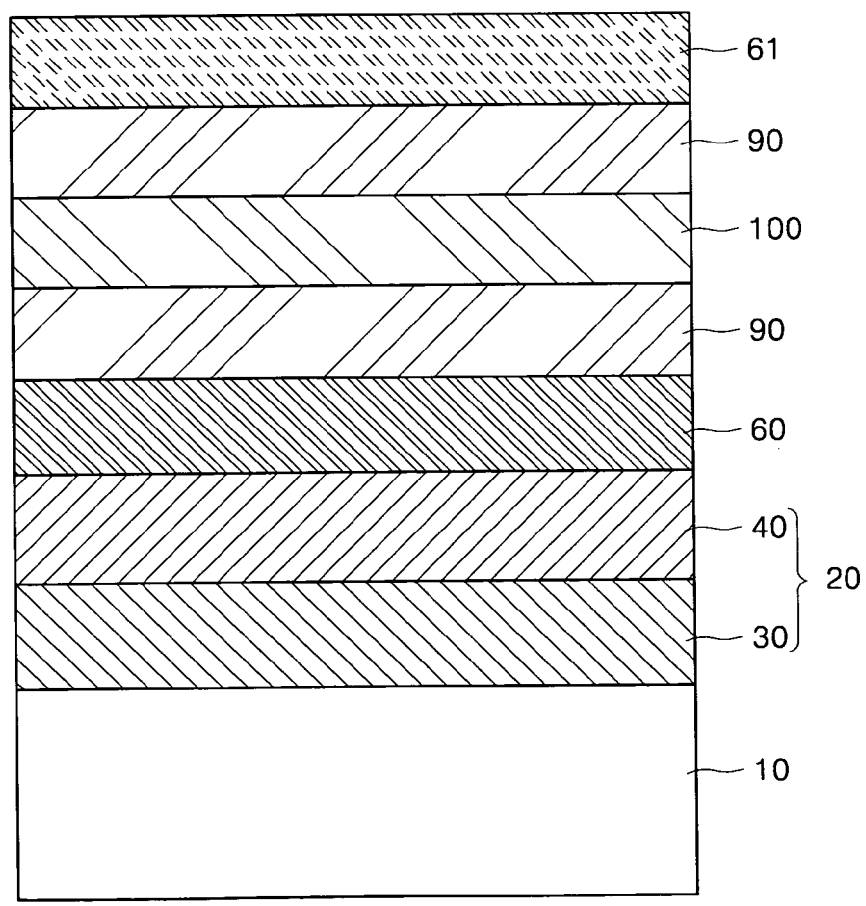
FIG. 4 to FIG. 9 schematically shows cross-sectional views of a light-emitting device in accordance with a second embodiment of the present invention.

FIG. 4 schematically shows a cross-sectional view of an inorganic EL device using a light-emitting device substrate in accordance with a second embodiment. A light control layer 20 is formed on one surface of a light transparent substrate 10, and on top of that, an electrode layer 60, an insulating layer 90, an inorganic layer 100, an insulating layer 90, and an electrode layer 61 are sequentially formed. The light control layer 20 consists of the first layer and the second layer 40 which are sequentially formed from the light transparent substrate 10, wherein the refractive index of the first layer 30 is higher than that of the light transparent substrate 10, and the refractive index of the second layer 40 is lower than that of the first layer 30. The first layer 30 is positioned on the light transparent substrate 10. In addition, any of well known configuration or constitutional material for the same may be employed.

In accordance with the present embodiment, a spherical-wave-shaped wavefront emitted from the emission layer 100 to all directions is converted into a plane-wave-shaped wavefront in the light control layer 20. As a result, the light may be effectively extracted outside the substrate.

Third Embodiment

Figure 5:
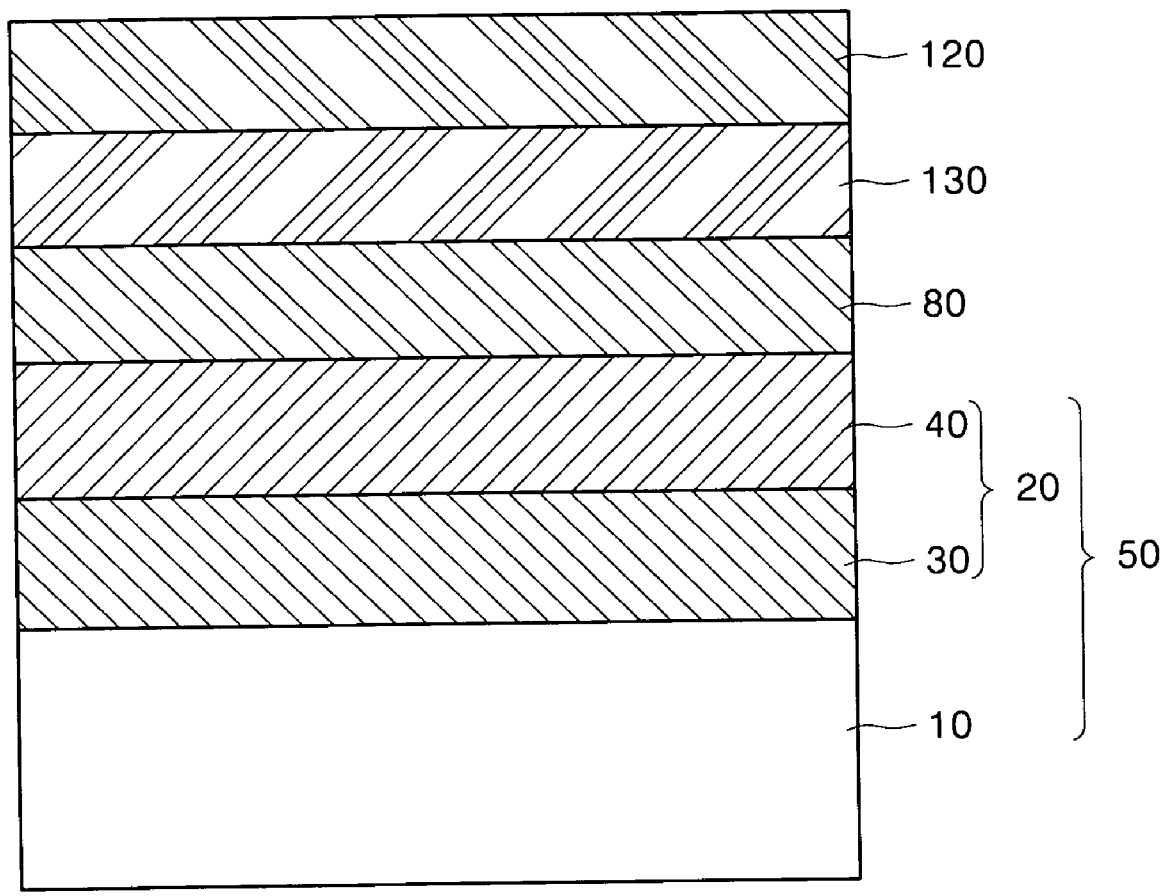

This embodiment relates to a case when the light-emitting device substrate described in the first embodiment is applied to an organic EL device. FIG. 5 schematically shows a cross-sectional view of a structure of the organic EL device in accordance with the present embodiment. An anode 80, an emission layer 130, and a cathode 120 are sequentially formed on the light-emitting device substrate 50 in accordance with the present embodiment.

Figure 6:
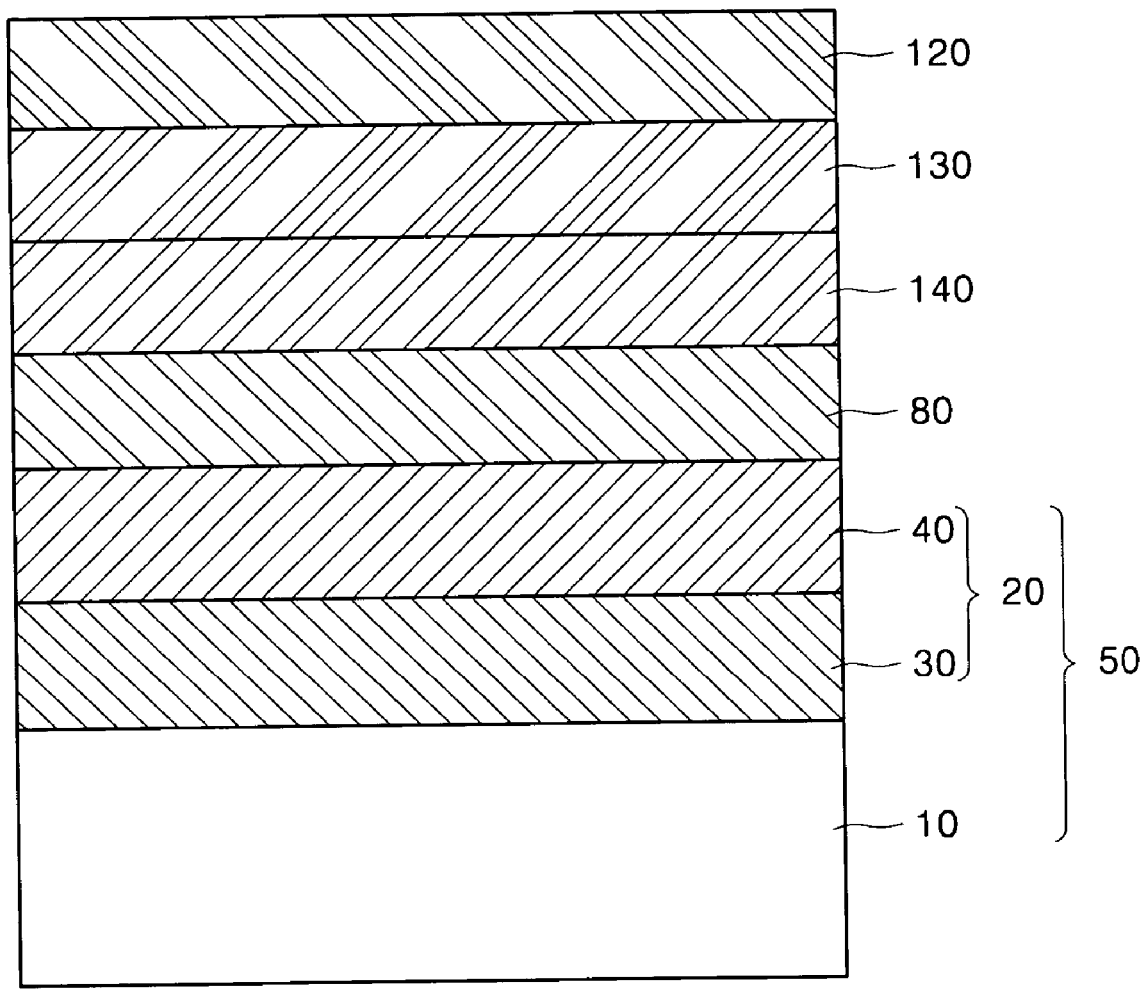

FIG. 6 schematically shows a cross-sectional view of another structure of an organic EL device in accordance with the present embodiment. An anode 80, a hole transporting layer 140, an emission layer 130, and a cathode 120 are sequentially formed on the light-emitting device substrate 50 in accordance with the present embodiment. Alternatively, a structure consisted of anode/hole transporting layer/emission layer/electron transporting layer/cathode, or structure consisted of anode/emission layer/electron transporting layer/cathode may be employed. Furthermore, the organic EL device in accordance with the present embodiment may be any of a small molecular type and a polymer type. In addition, the light-emitting device substrate 50 of the organic EL device in accordance with the present embodiment is arranged to allow the light emitting from the emission layer to transmit the light-emitting device substrate 50.

Various materials may be used for the hole transporting material. Specifically, triphenyldiamine base molecule such as bis(di(P-tril)aminophenyl)-1,1-cyclohexane, N-N'-diphenyl-N,N'-bis(3-metylphenyl)-1,1'-biphenyl-4,4'-diamine, N,N'-diphenyl-N-N-bis(1-naphtyl)-1,1'-biphenyl)-4,4'-diamine or starburst type molecule may be used.

Various materials may be used for the electron transporting material. Specifically, oxadizol derivative such as 2-(4-biphenyl)-5-(4-t-butylphenyl)-1,3,4-oxadiazole, bis{2-(4-t-butylphenyl)-1,3,4-oxadiazole}-m-phenylene, triazol derivative, quinolinol metal complex may be used, however, not limited to these examples.

For example, tris(8-quinolinol) aluminum complex (Alq3) or bisdiphenylvinylbiphenyl (BDPVBi), 1,3-bis(p-t-butylphenyl-1,3,4-oxadiazolil)phenyl (OXD-7), N,N'-bis(2,5-di-t-butylphenyl) perylenetetracarbonic acid dimide (BPPC), 1,4bis(p-tril-p-methylstyrilphenyl)naphtalene may be used for the light emitting material. Alternatively, charge transporting material doped with fluorescent material may be used for the light emitting material. For example, the quinolinol metal complex such as Alq3 doped with quinacridone derivative such as 4-dicyanomethylene-2-methyl-6-(p-dimetylaminostyril)-4H-pyran (DCM), 2,3-quinacridone [7], doped with qumarine derivative such as 3-(2'-benzotiazol)-7-diethylaminoqumarine, or the electron transporting material of bis(2-metyl-8-hydroxyquinoline)-4-phenylphenol-aluminum complex doped with condensation polycyclic aromatic such as perylene, or the hole transporting material of 4,4'-bis(m-trilphenylamino)biphenyl (TPD) doped with rubrene may be used.

In devices shown in FIG. 5 and FIG. 6, the anode 80 is responsible for injecting holes into the hole transporting layer and preferably has a work function of 4.5 eV or more. Specific example of the anode 80 material used in the present embodiment may include Indium Tin Oxide (ITO), NESA, gold, silver, platinum, copper, however, ITO is preferable. In addition, the refractive index of the second layer 40 and the refractive index of the anode 80 of the organic EL device may be different from each other, and it is preferable to have the refractive index of the second layer 40 higher than that of the anode 80 when the second layer 40 in contact with the anode layer 80.

In the meantime, a material having a low value of work function for the purpose of injecting electrons into the electron transporting band or the emission layer is preferably used for the cathode 120. The material for the cathode 120 is not specifically limited, however, indium, aluminum, magnesium, magnesium-indium alloy, magnesium-aluminum alloy, aluminum-lithium alloy, aluminum-scandium-lithium alloy, or magnesium-silver alloy may be used for the same. In addition, the organic EL device in accordance with the present embodiment may be used as the passive drive type, or the active drive type by adding an active device such as TFT. The method for forming each layer of the organic EL device in the present embodiment is not specifically limited but selected from well-known methods. For example, vacuum deposition, molecular beam epitaxy (MBE), or dipping of solution resolved with a solvent, spin coating, casting, bar coating, roll coating may be used.

The light control layer 20 converts the spherical-wave-shaped wavefront emitted from the emission center of the emission layer to the plane-wave-shaped wavefront. With this function, the light that has transmitted the light control layer 20 has the plane-wave-shaped wavefront, and propagates into the light transparent substrate 10 in a state of having directivity. When color converting filter or color filter is formed, the function of filter may be effectively used because of configuration described above. In other words, the light emitted from the emission layer is suppressed from propagating into an adjacent pixel, which leads to maintain color purity.

The filter may be arranged on any surface of the light-emitting device substrate in accordance with the present embodiment, and the display may maintain high color purity even when the filter is arranged on the side opposite to the emission layer of the light-emitting device substrate. In general, it is difficult to form an electrode or emission layer on the color converting filter or color filter in terms of fabrication process. However, when the filter is arranged on the light transparent substrate 10 opposite to the emission layer, the process for fabricating the color converting filter or the color filter may be facilitated, which is separate from the process for fabricating the electrode or the emission layer. For example, it is possible to form the color converting filter or the color filter after the light-emitting device is formed. When the color converting filter is used, any kinds of the color converting filter or light emitting color of the emission layer may be used. A red converting filter for converting a blue color into a red color and a green converting filter for converting the blue color into a green color may be flatly arranged using a blue emission layer to thereby implement full color.

Figure 7:
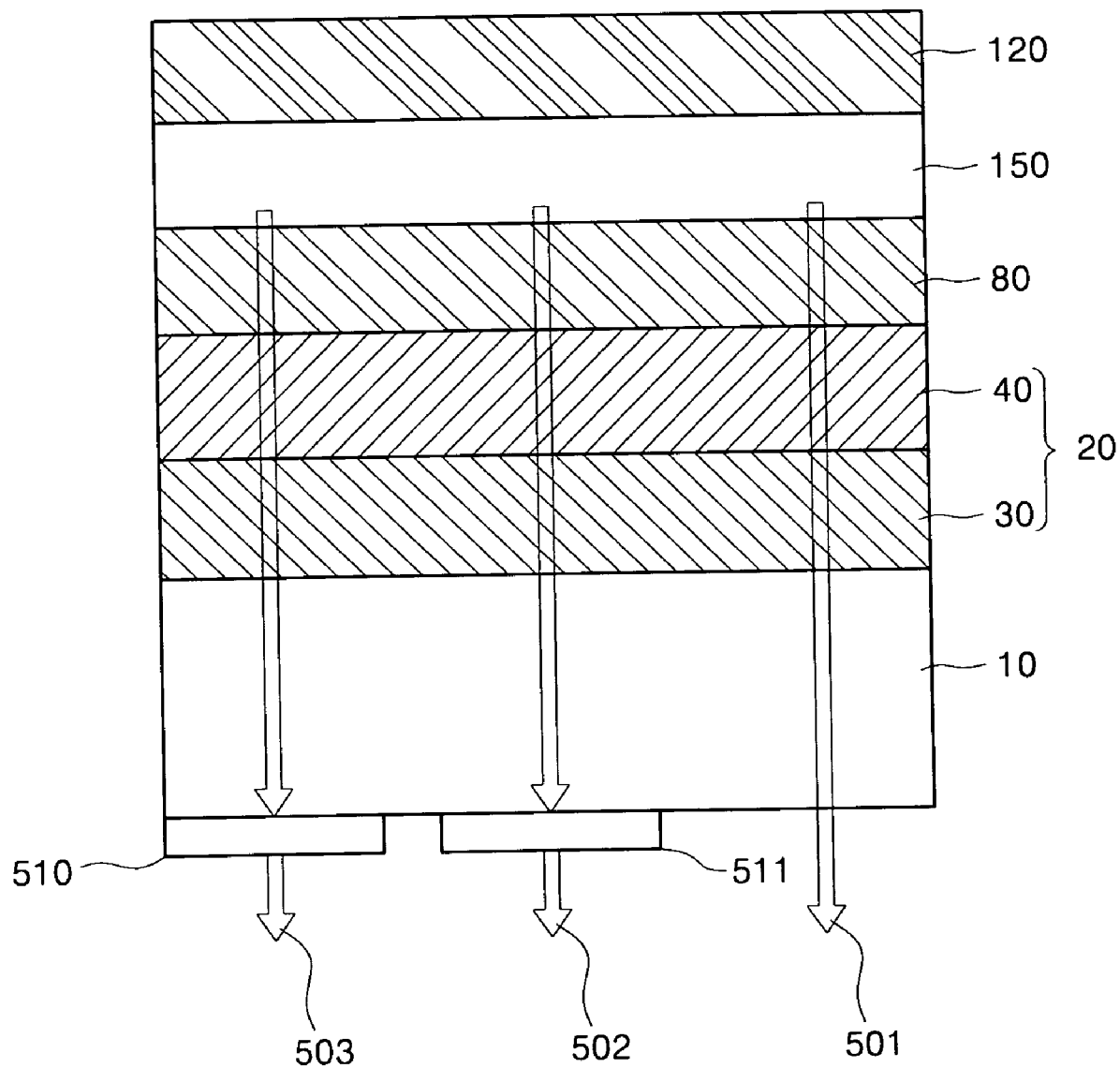

FIG. 7 schematically shows a cross-sectional view of an organic EL device having a color converting filter. A red converting filter 510 and a green converting filter 511 are arranged on one surface of a light transparent substrate 10, and a light control layer 20, an anode 80, a blue emission layer 150, and a cathode 120 are sequentially arranged on the other surface of the light transparent substrate. The blue emitting light 501 is converted into a red emitting light 503 in the red converting filter and into a green emitting light 502 in the green converting filter. In this case, the blue emitting light may directly emit without any filters, or the light may emit through the color filter formed to improve purity. As mentioned above, the light that has transmitted the light control layer 20 has a plane-wave-shaped wavefront, and propagates into the light transparent substrate 10 in a state of directivity, so that display without uneven color may be implemented even when each pixel size of red, green, blue colors becomes fine.

Figure 8:
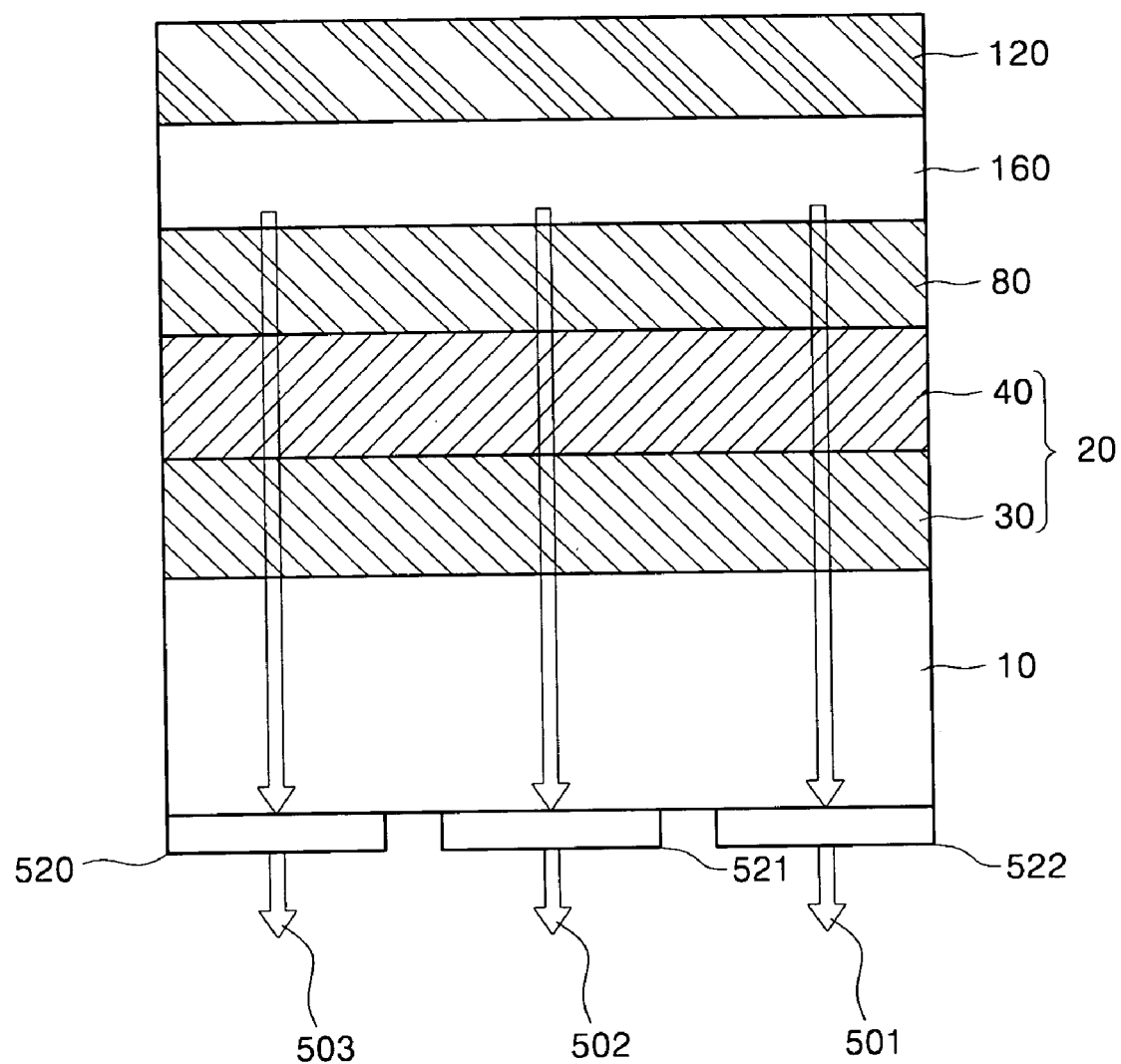

FIG. 8 schematically shows a cross-sectional view of an organic EL device having a color filter. A full color display may be implemented with red, green, blue color filters by means of white emission layer. To detail this, a red color filter 520, a green color filter 521, and a blue color filter 522 are arranged on one surface of a light transparent substrate 10, and a light control layer 20, anode 80, a white emission layer 160, and a cathode 120 are sequentially arranged on the other surface of the light transparent substrate. White color light emitting from the white emission layer are separated into red emitting light 503, green emitting light 502, and blue emitting light 501 at the red color filter 520, the green color filter 521, and the blue color filter 522, respectively. As mentioned above, the light that has transmitted the light control layer has a plane-wave-shaped wavefront, and propagates into the light transparent substrate 10 in a state of directivity, so that display without uneven color may be implemented even when each pixel size of red, green, blue colors becomes fine.

The light-emitting device substrate in accordance with the present embodiment may be used as the encapsulating material of the organic EL device. The light-emitting device substrate is arranged to allow light emitting from the emission layer to transmit the light-emitting device substrate in the organic EL device in accordance with the present embodiment as mentioned above. In the top emission type or reverse type of the organic EL device in which light emits from the emission layer into a direction opposite to the substrate where the electrode layer 60 or the emission layer is formed, the light-emitting device substrate may be used as the encapsulating material in accordance with the present embodiment. When it is used as the encapsulating material, it is preferable to attach the light-emitting device substrate to the utmost surface of the light-emitting device under reduced pressure.

FIG. 4 to FIG. 8 shows a layer structure of a light-emitting device portion, however, this structure actually has a light-emitting device drive circuit such as TFT in the light transparent substrate 10. FIG. 9 schematically shows a cross-sectional view of an organic EL device having TFT. A TFT device portion 530 is formed in a drive circuit forming region of the light transparent substrate 10. In the meantime, a light-emitting device forming region of the light transparent substrate 10 has a light-emitting device consisting of a light control layer 20, an anode 80, an emission layer 130 and a cathode 120. The layer structure of the light-emitting device is not limited to the shown example and may be varied. In addition, color filter or color converting filter is not shown in the same figure. In this case, when a high refractive layer is present in a pixel display portion of the TFT substrate, the high refractive layer may be used as the first layer 30.

Fourth Embodiment

Figure 10:
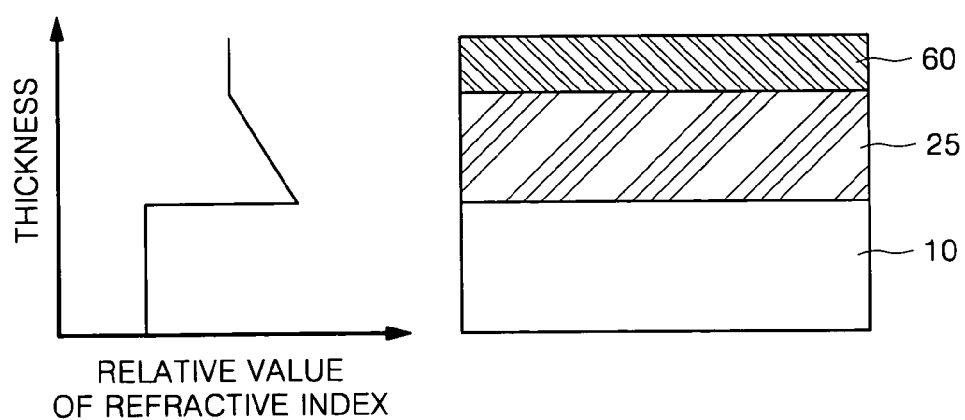
FIG. 10 shows an exemplary structure of a light control portion.

FIG. 10 shows a configuration of a light-emitting device substrate in accordance with the present embodiment. A light control layer 25 consists of a derivative doped with impurity metal among its constitutional layers. Impurity concentration of the light control layer is distributed to be higher from the light transparent substrate 10 toward the electrode layer 60. By means of such configuration, the refractive index from the light transparent substrate 10 toward the electrode layer 60 is gradually decreased.

The light control layer 25, for example, consists of a mixture containing impurity and $MgF_2$, or $SiO_2$. Cr, Ag, Al or the like may be used for the impurity. The amount of metal doping may be properly selected, and typically 5 mol % or less is selected with respect to the total material forming the light control layer 25. By means of such configuration, a transmitting rate due to metal absorption may be suppressed from being lowered.

Refractive indices of the light control layer 25 are adjusted by adjusting the impurity concentration in the present embodiment. Wavefront conversion is performed in a region where the refractive index increases with respect to the light propagation direction, and the light is converted from the spherical wave shaped light into the plane-wave-shaped light to thereby increase the directivity of the light. Such wavefront conversion is not performed only at single interface but performed several times in a portion where the refractive indices of the light control layer 25 are adjusted. As a result, the wavefront conversion into the plane-wave-shaped light is securely implemented.

The substrate of the present embodiment has the above-mentioned configuration, so that light reflection or loss in the interface between the light control layer 25 and the light transparent substrate 10 is reduced, which also leads to significantly improve the light extraction efficiency.

The present invention has been described with embodiments. These embodiments are only some examples, and may be modified, which is also in the scope of the present invention as is understood by the skilled in the art For example, the EL device has been described as an example, however, the present invention may be applied to other light-emitting devices such as light-emitting diode. The light-emitting device may be used as a display device as an example.

In addition, the light control layer 20 has been shown to have two layers, however, it is not limited to this two layers and may have three layers or more. In this case, it is preferable to distribute the refractive index higher from the emission layer toward the light transparent substrate.

EXAMPLE

Hereinafter, the present invention will be described in detail based on the example. The luminescence property of the organic EL device is as follows in examples to be described below. A luminance meter (TOPCON BM-5A) is arranged in a normal direction of the substrate with the focusing angle of 0.1°. In addition, the emission area of the organic EL device is 4 mm$^2$, and a direct current voltage is applied to the device to measure the current efficiency when the luminance is 100 cd/m$^2$. In addition, the thickness of the light transparent substrate to be used is all 0.7 mm.

First Example

Melted quartz having a refractive index of 1.457 is used as the light transparent substrate, and a first layer of a light control layer is deposited with TiO$_2$ by means of sputtering to have a refractive index of 2.30 and a thickness of 700 nm on one surface of the light transparent substrate, and on top of that, a second layer of the light control layer is deposited with TiO$_2$/SiO$_2$ by means of sputtering to have a refractive index of 1.99 and a thickness of 378 nm, which forms the light-emitting device substrate.

In addition, ITO as an anode is deposited on the light-emitting device substrate by means of sputtering to have a sheet resistance of 20 Ω/□. The layer thickness of ITO is 100 nm and the refractive index of the same is 1.78.

Next, Two layers are formed on the ITO as an organic layer. A hole transporting layer of N,N'-bis(3-methylphenyl)-N,N'-diphenyl-[1,1'-biphenyl]-4,4'-diamine is first formed by vacuum deposition to have a thickness of 50 mm, an emission layer of tris(8-quinolinorat)aluminum is then formed by the vacuum deposition to have a thickness of 70 nm. Finally, a cathode of a magnesium-silver alloy is codeposited by the vacuum deposition at a deposition rate of 9:1 to have a thickness of 150 nm, which forms the organic EL device of green emitting light (which has a peak wavelength of 530 nm). As a result, the current efficiency is 7.0 cd/A, which is about 2.3 times compared to the result of a first comparative example.

Second Example

The layer thickness of the TiO$_2$ is changed to be 200 nm in the organic EL device manufactured in the first example. The current efficiency becomes 6.3 cd/A, which exceeds the result of the first comparative example.

Third Example

The layer thickness of the TiO$_2$ is changed to be 2000 nm in the organic EL device manufactured in the first example. The current efficiency becomes 4.9 cd/A, which exceeds the result of the first comparative example.

Fourth Example

The layer thickness of the TiO$_2$/SiO$_2$ is changed to be 200 nm in the organic EL device manufactured in the first example. The current efficiency becomes 6.0 cd/A, which exceeds the result of the first comparative example.

Fifth Example

The layer thickness of the TiO$_2$/SiO$_2$ is changed to be 3000 nm in the organic EL device manufactured in the first example. The current efficiency becomes 4.0 cd/A, which exceeds the result of the first comparative example.

Sixth Example

The layer thickness of the TiO$_2$ is changed to be 116 nm, and the layer thickness of the TiO$_2$/SiO$_2$ is changed to be 134 nm in the organic EL device manufactured in the first example. The current efficiency becomes 3.6 cd/A, which exceeds the result of the first comparative example.

First Comparative Example

The layer structure and fabrication method same as the first example have been performed to form the organic El device except forming the light control layer. The current efficiency of this device is 3.0 cd/A.

Second Comparative Example

The layer structure and fabrication method same as the first comparative example have been performed to form the organic EL device except that only the second layer of TiO$_2$ having a refractive index of 2.30 is deposited on the light transparent substrate by means of sputtering to have a thickness of 378 nm without having the first layer of the light control layer. The current efficiency of this device is 2.9 cd/A.

Third Comparative Example

The layer structure and fabrication method same as the first comparative example have been performed to form the organic EL device except that only the first layer of TiO$_2$/SiO$_2$ composite layer having a refractive index of 2.30 is deposited on the light transparent substrate by means of sputtering to have a thickness of 700 nm without having the second layer of is the light control layer. The current efficiency of this device is 2.4 cd/A.

Fourth Comparative Example

The layer structure and fabrication method same as the first example have been performed to form the organic EL device except that the thickness of TiO$_2$ layer (namely, the first layer) is 15 nm. The current efficiency of this device is 2.9 cd/A and no improvement for the light extraction efficiency has been observed. In this example, it is expected that no improvement be resulted from the extremely thin first layer, which causes interfaces of the first layer and the second layer not to sufficiently perform the wavefront converting function, and the resultant light extraction efficiency not to be improved.

Fifth Comparative Example

The layer structure and fabrication method same as the first example have been performed to form the organic EL device except that soda glass having a refractive index of 1.512 is used as the light transparent substrate and the light control layer is not present. The current efficiency of this device is 3.0 cd/A.

Sixth Comparative Example

The layer structure and fabrication method same as the first example have been performed to form the organic EL device except that $SiO_2$ having a refractive index of 1.25 is used as the second layer of the light control layer by means of a sol-gel method. The luminous efficiency of the organic El device is 3.1 cd/A, however, several spots that do not emit light (namely, dark spots) have been observed.

Seventh Comparative Example

The layer structure and fabrication method same as the first example have been performed to form the organic EL device except that an anti-reflective layer is formed instead of the light control layer. A composite layer of $TiO_2/SiO_2$ having a refractive index of 1.59 is formed to have a thickness of 84 nm by sputtering to be used as the anti-reflective layer. The current efficiency of this device is 2.8 cd/A, and no improvement has been observed. It became obvious that the light extraction efficiency can not be sufficiently increased by the anti-reflective layer in consideration of its own function when it is formed in the organic EL device.

Evaluation results of the above-mentioned examples and comparative examples are shown below. In the tables shown below, the refractive index of the first layer is $n1$, its layer thickness is $d1$, the refractive index of the second layer is $n2$, its layer thickness is $d2$, and the refractive index of anode is $n3$. In addition, the refractive index of the light transparent substrate is $n(sub)$.

TABLE 1

|  | First example | Second example | Third example | Fourth example | Fifth example | Sixth example |
|---|---|---|---|---|---|---|
| Refractive index of first layer | 2.30 | 2.30 | 2.30 | 2.30 | 2.30 | 2.30 |
| Thickness of first layer (nm) | 700 | 200 | 2000 | 700 | 700 | 116 |
| Refractive index of second layer | 1.99 | 1.99 | 1.99 | 1.99 | 1.99 | 1.99 |
| Thickness of second layer (nm) | 378 | 378 | 378 | 200 | 3000 | 134 |
| Refractive index of electrode layer | 1.78 | 1.78 | 1.78 | 1.78 | 1.78 | 1.78 |
| Thickness of electrode layer (nm) | 100 | 100 | 100 | 100 | 100 | 100 |
| Emission wavelength (nm) | 530 | 530 | 530 | 530 | 530 | 530 |
| Current efficiency (cd/A) | 7.0 | 6.3 | 4.9 | 6.0 | 4.0 | 3.6 |
| $n1d1/\lambda$ | 3.04 | 0.87 | 8.68 | 3.04 | 3.04 | 0.50 |
| $n2d2/\lambda$ | 1.42 | 1.42 | 1.42 | 0.75 | 11.26 | 0.50 |
| $n1/n(sub)$ | 1.56 | 1.56 | 1.56 | 1.56 | 1.56 | 1.56 |
| $n1/n2$ | 1.16 | 1.16 | 1.16 | 1.16 | 1.16 | 1.16 |
| $n2/n3$ | 1.12 | 1.12 | 1.12 | 1.12 | 1.12 | 1.12 |

TABLE 2

|  | First comparative example | Second comparative example | Third comparative example | Fourth comparative example |
|---|---|---|---|---|
| Refractive index of first layer |  |  | 2.30 | 2.30 |
| Thickness of first layer (nm) |  |  | 700 | 15 |
| Refractive index of second layer |  | 2.30 |  | 1.99 |
| Thickness of second layer (nm) |  | 378 |  | 378 |
| Refractive index of electrode layer | 1.78 | 1.78 | 1.78 | 1.78 |
| Thickness of electrode layer (nm) | 100 | 100 | 100 | 100 |
| Emission wavelength (nm) | 530 | 530 | 530 | 530 |
| Current efficiency (cd/A) | 3.0 | 2.9 | 2.4 | 2.9 |
| $n1d1/\lambda$ |  |  | 3.04 | 0.07 |
| $n2d2/\lambda$ |  | 1.64 |  | 1.42 |
| $n1/n(sub)$ |  |  | 1.56 | 1.56 |
| $n1/n2$ |  |  |  | 1.16 |
| $n2/n3$ |  | 1.29 |  | 1.12 |

TABLE 3

|  | Fifth comparative example | Sixth comparative example | Seventh comparative example |
|---|---|---|---|
| Refractive index of first layer |  | 2.30 | 1.59 |
| Thickness of first layer (nm) |  | 700 | 84 |
| Refractive index of second layer |  | 1.25 |  |
| Thickness of second layer (nm) |  | 530 |  |
| Refractive index of electrode layer | 1.78 | 1.78 | 1.78 |
| Thickness of electrode layer (nm) | 100 | 100 | 100 |
| Emission wavelength (nm) | 530 | 530 | 530 |
| Current efficiency (cd/A) | 3.0 | 3.1 | 2.8 |
| $n1d1/\lambda$ |  | 3.03 | 0.25 |
| $n2d2/\lambda$ |  | 1.25 |  |
| $n1/n(sub)$ |  | 1.37 | 1.08 |
| $n1/n2$ |  | 1.61 |  |
| $n2/n3$ |  | 0.70 |  |

As mentioned above, the present invention has the light control portion that converts the spherical wave shaped incident light into the plane-wave-shaped light to be guided into the light transparent substrate, so that the emitting light may be effectively extracted outside the substrate. As a result, the luminance becomes increased to thereby provide a light-emitting device having good visibility.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A light-emitting device substrate, comprising:
   a light transparent substrate;
   a light control portion formed on the light transparent substrate to convert a spherical wave shaped incident light to a plane-wave-shaped light to be guided into the light transparent substrate, the light control portion having a substantially co-planar lower surface facing the light transparent substrate; and
   an electrode layer formed on an upper surface of the light control portion,
   wherein a refractive index near the upper surface of the light control portion is higher than that of the electrode layer.

2. The light-emitting device substrate as claimed in claim 1, wherein the light control portion consists of a plurality of light control layers, some of the plurality of light control layers having a refractive index distribution.

3. The light-emitting device substrate as claimed in claim 2, wherein the refractive indices of the refractive index distribution decrease toward the upper surface of the light control portion.

4. The light-emitting device substrate as claimed in claim 2, wherein the light control layers include a first layer formed on the light transparent substrate, and a second layer formed on the first layer and having a refractive index lower than that of the first layer.

5. The light-emitting device substrate as claimed in claim 4, wherein the light-emitting device substrate has a light-emitting device having a peak emission wavelength ($\lambda$) mounted on the substrate, and $n1d1 \geq \lambda/2$ is met when the refractive index of the first layer is n1 and its thickness is d1.

6. The light-emitting device substrate as claimed in claim 4, wherein the light-emitting device substrate has a light-emitting device having a peak emission wavelength ($\lambda$) mounted on the substrate, and $n2d2 \geq \lambda/2$ is met when the refractive index of the second layer is n2 and its thickness is d2.

7. The light-emitting device substrate as claimed in claim 1, wherein the light transparent substrate has a drive circuit for driving the light-emitting device.

8. A light-emitting device, comprising:
   a light transparent substrate;
   a light control portion formed on the light transparent substrate to convert a spherical wave shaped incident light to a plane-wave-shaped light to be guided into the light transparent substrate, the light control portion having a substantially co-planar lower surface facing the light transparent substrate;
   an electrode layer formed on an upper surface of the light control portion, wherein a refractive index near the upper surface of the light control layer is higher than that of the electrode layer; and
   an emission layer formed on the electrode layer.

9. The light-emitting device as claimed in claim 8, wherein the light control portion consists of a plurality of light control layers, some of the plurality of light control layers having a refractive index distribution.

10. The light-emitting device as claimed in claim 9, wherein the refractive indices of the refractive index distribution decrease toward the upper surface of the light control portion.

11. The light-emitting device as claimed in claim 9, wherein the light control layers include a first layer formed on the light transparent substrate, and a second layer formed on the first layer and having a refractive index lower than that of the first layer.

12. The light-emitting device as claimed in claim 9, wherein $n1d1 \geq \lambda/2$ is met when a peak emission wavelength of the emission layer is $\lambda$, the refractive index of the first layer is n1, and its thickness is d1.

13. The light-emitting device as claimed in claim 9, wherein $n2d2 \geq \lambda/2$ is met when the peak emission wavelength of the emission layer is $\lambda$, the refractive index of the second layer is n2, and its thickness is d2.

14. The light-emitting device as claimed in claim 9, wherein the light transparent substrate has a color converting filter.

15. The light-emitting device as claimed in claim 9, wherein the light transparent substrate has a color filter.

16. The light-emitting device as claimed in claim 9, wherein light emitted from the emission layer is single color light.

17. The light-emitting device as claimed in claim 16, wherein the single color light is blue light.

18. The light-emitting device as claimed in claim 8, wherein the light-emitting device is an organic EL device.

* * * * *